US006981312B2

(12) United States Patent
Rezaei

(10) Patent No.: US 6,981,312 B2
(45) Date of Patent: Jan. 3, 2006

(54) SYSTEM FOR HANDLING MICROELECTRONIC DIES HAVING A NON-PIERCING DIE EJECTOR

(75) Inventor: Frederick F. Rezaei, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 129 days.

(21) Appl. No.: 10/404,980

(22) Filed: Mar. 31, 2003

(65) Prior Publication Data

US 2004/0187298 A1    Sep. 30, 2004

(51) Int. Cl.
     *B23P 19/00*      (2006.01)
(52) U.S. Cl. .............................. 29/740; 29/739; 29/741
(58) Field of Classification Search ................. 29/740, 29/741, 739, 743; 228/743
See application file for complete search history.

(56) References Cited

U.S. PATENT DOCUMENTS

| | | | | |
|---|---|---|---|---|
| 3,785,507 A | * | 1/1974 | Wiesler et al. ................ 29/700 |
| 4,166,562 A | * | 9/1979 | Keizer et al. ................. 228/5.1 |
| 4,375,126 A | * | 3/1983 | Dull et al. ..................... 29/740 |
| 4,494,902 A | * | 1/1985 | Kuppens et al. .............. 221/74 |
| 4,850,780 A | * | 7/1989 | Safabakhsh et al. ..... 414/416.1 |
| 4,990,051 A | * | 2/1991 | Safabakhsh et al. ........ 156/344 |
| 6,190,115 B1 | * | 2/2001 | Suzuki et al. ............ 414/752.1 |
| 6,494,667 B1 | * | 12/2002 | Suzuki et al. ............ 414/751.1 |

* cited by examiner

*Primary Examiner*—Carl J. Arbes
(74) *Attorney, Agent, or Firm*—Blakely, Sokoloff, Taylor & Zafman LLP

(57) ABSTRACT

According to one aspect of the invention, a system for handling microelectronic dies is provided. A wafer support, to support a diced semiconductor wafer having microelectronic dies, is mounted to the frame. An ejector head is connected to the frame for movement below the wafer. A pick head is connected to the frame for movement above the wafer. The ejector head has a passageway therethrough and an intake and an outlet. An air pump is connected to the intake to shoot air from the outlet towards one of the dies. The air impinges the wafer support, exerting a force on the die, to assist the pick head in removing the die from the wafer support.

26 Claims, 8 Drawing Sheets

SYSTEM FOR HANDLING MICROELECTRONIC DIES HAVING A NON-PIERCING DIE EJECTOR

BACKGROUND OF THE INVENTION

1). Field of the Invention

Embodiments of this invention relate to the field of semiconductor chip processing and more particularly to an apparatus used in semiconductor chip processing.

2). Discussion of Related Art

Integrated circuits are formed on circular semiconductor wafers. The wafers are placed on sheets with adhesive on them and then sawed between the integrated circuits to form semiconductor chips also known as microelectronic dies.

The sawed wafers are then placed in a handling machine that includes a die ejector and a pick-and-place subsystem. The die ejector has an ejector head which separates each microelectronic die from the adhesive sheet which is then picked from the sheet and then placed on an integrated circuit board by the pick-and-place subsystem. Typically the ejector head has piercing pins which pierce the adhesive sheet and lift the microelectronic dies from the sheet so that they may be picked by the pick-and-place head.

One disadvantage of this system is that as microelectronic dies become thinner, the piercing ejector pins must eject the dies more slowly otherwise the thin, fragile dies will crack. Even slow moving pins cannot consistently operate to eject dies with thicknesses below 50 microns without the dies cracking. Another disadvantage is that even with die thicknesses for which piercing pins may be used, in order not to crack the dies, the pins must be slowed down such that the output of the microelectronic die handling system is reduced.

BRIEF DESCRIPTION OF THE DRAWINGS

An embodiment of the invention is described by way of example with reference to the accompanying drawings, wherein.

DETAILED DESCRIPTION OF THE INVENTION

FIG. 1a to FIG. 7 of the accompanying drawings illustrate a system for handling microelectronic dies. A wafer support, to support a diced semiconductor wafer having microelectronic dies, is mounted to the frame. An ejector head is connected to the frame for movement below the wafer. A pick head is connected to the frame for movement above the wafer. The ejector head has a passageway therethrough and an intake and an outlet. An air pump is connected to the intake to shoot air from the outlet towards one of the dies. The air impinges the wafer support, exerting a force on the die, to assist the pick head in removing the die from the wafer support.

Figure 1A:
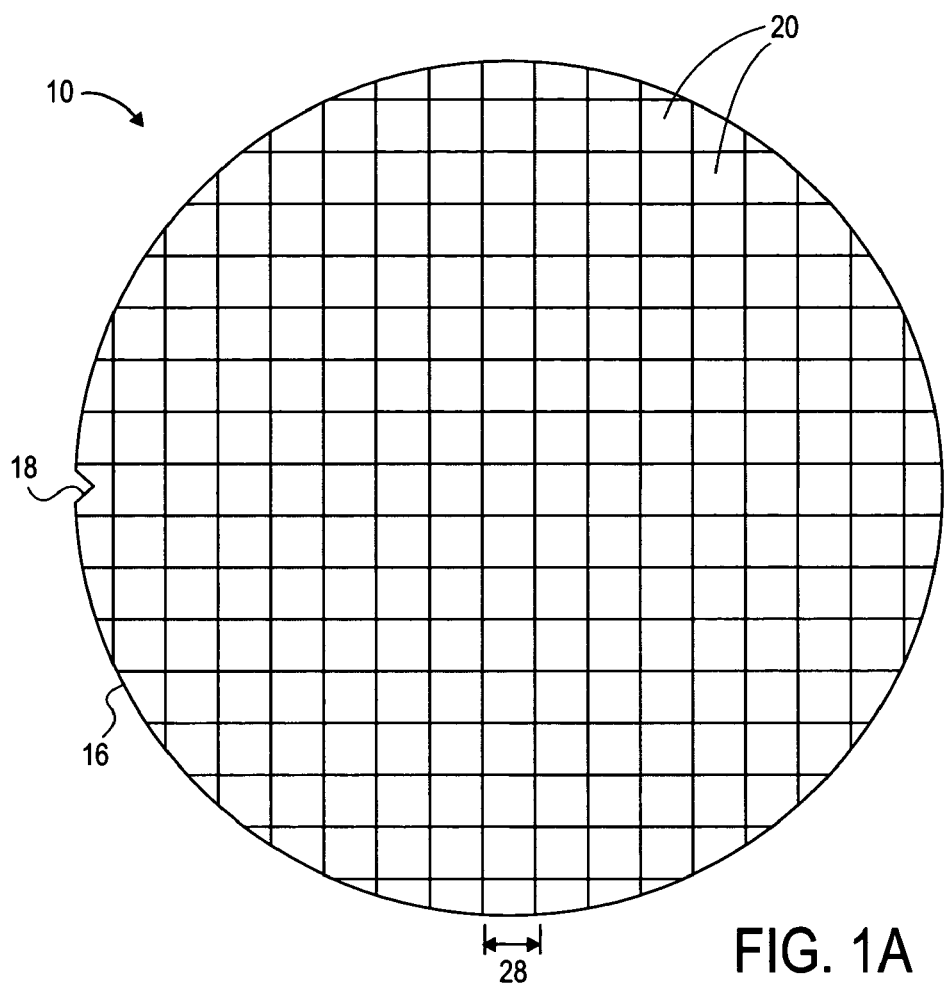
FIG. 1a is a top plan view of a typical silicon semiconductor wafer.
Figure 1B:
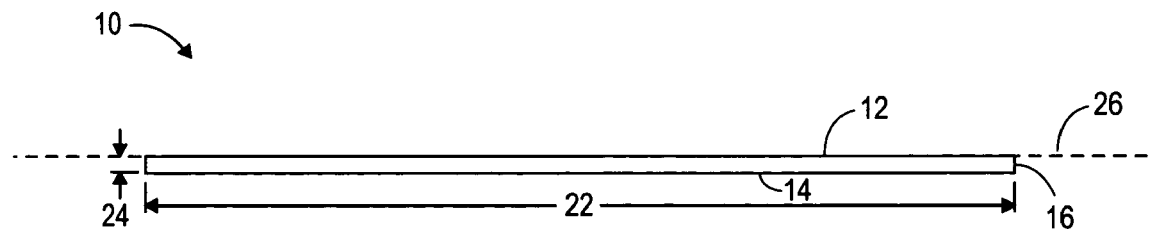
FIG. 1b is cross-sectional side view of the wafer.

FIGS. 1a and 1b illustrate a typical semiconductor wafer 10. The semiconductor wafer 10 is made of silicon and has an upper surface 12, a lower surface 14, an outer edge 16, a notch 18, and a plurality of integrated circuits 20 formed thereon. The outer edge 16 is circular in shape with a diameter 22 of 300 mm and a thickness 24 of 50 microns. The notch 18 is formed on the outer edge 16 of the wafer 10. The upper surface 12 is flat and lies in a plane 26 extending beyond the outer edge 16 of the wafer 10.

The integrated circuits 20 of square with sides 28 of, for example, 20 mm. To separate the integrated circuits 20, the wafer 10 is sawed, or diced, between the integrated circuits 20 to form semiconductor chips also known as microelectronic dies.

Figure 2:
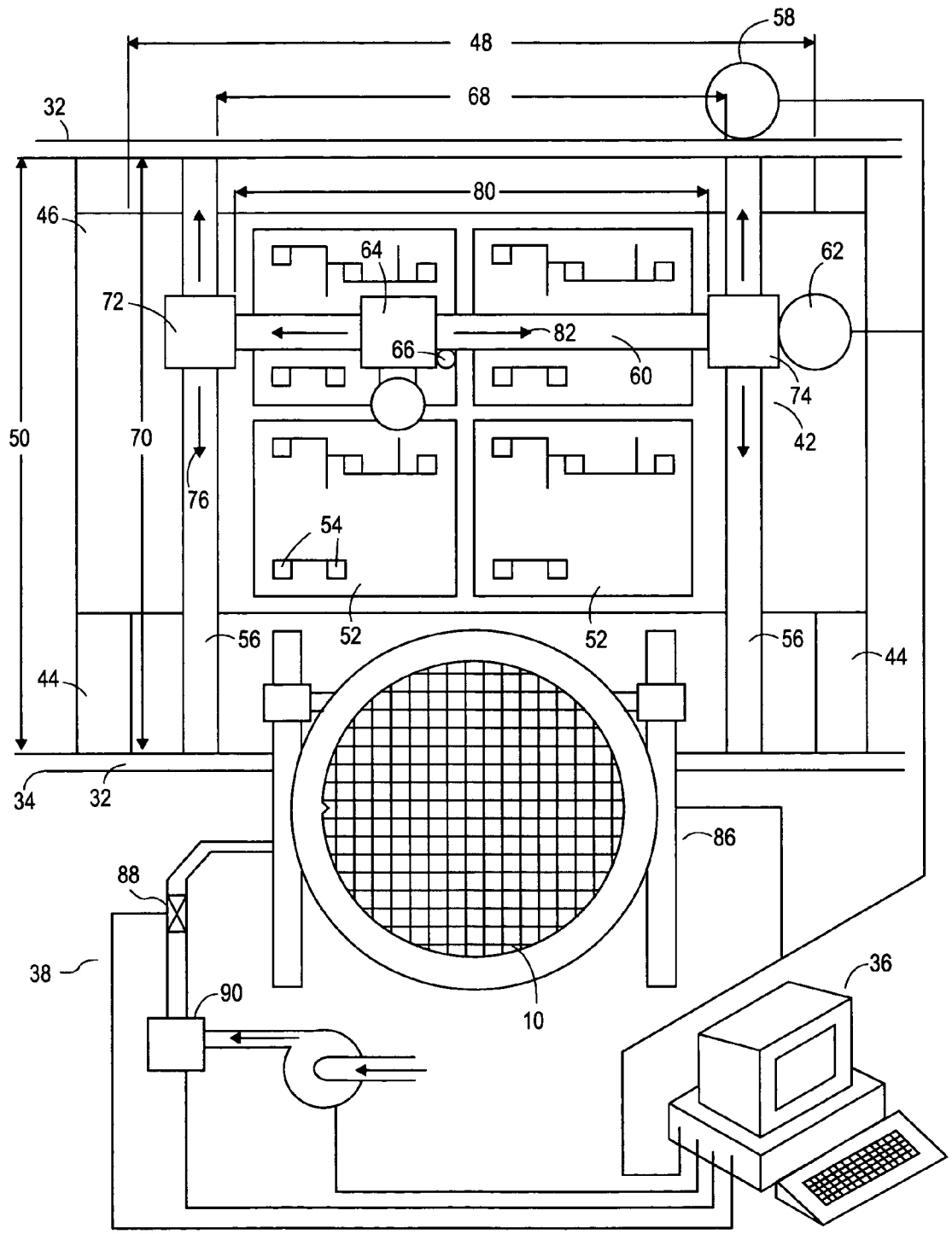
FIG. 2 is a top plan view of a microelectronic die handling system including a pick-and-place subsystem and a die ejector.
Figure 3:
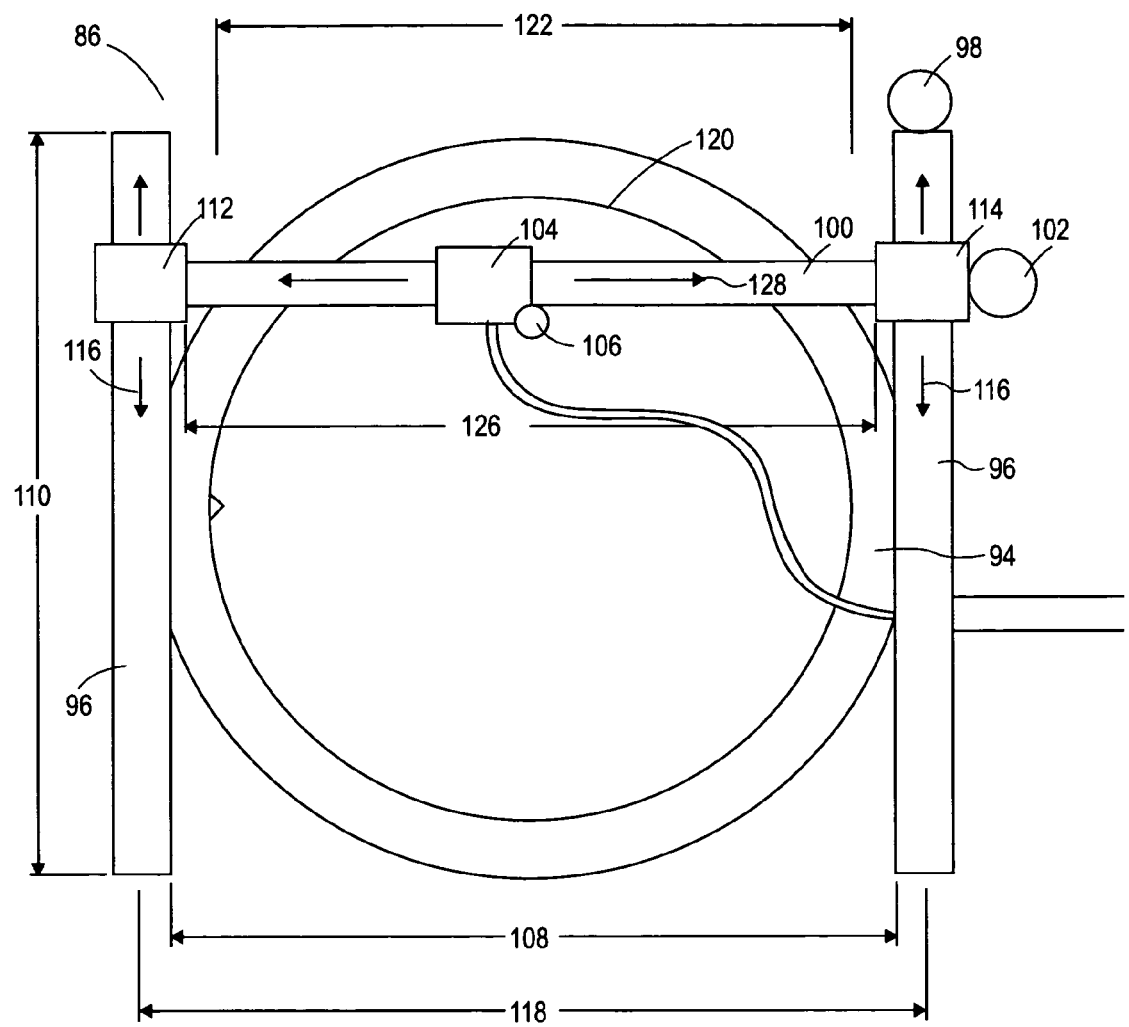
FIG. 3 is a bottom view of the die ejector.
Figure 4:
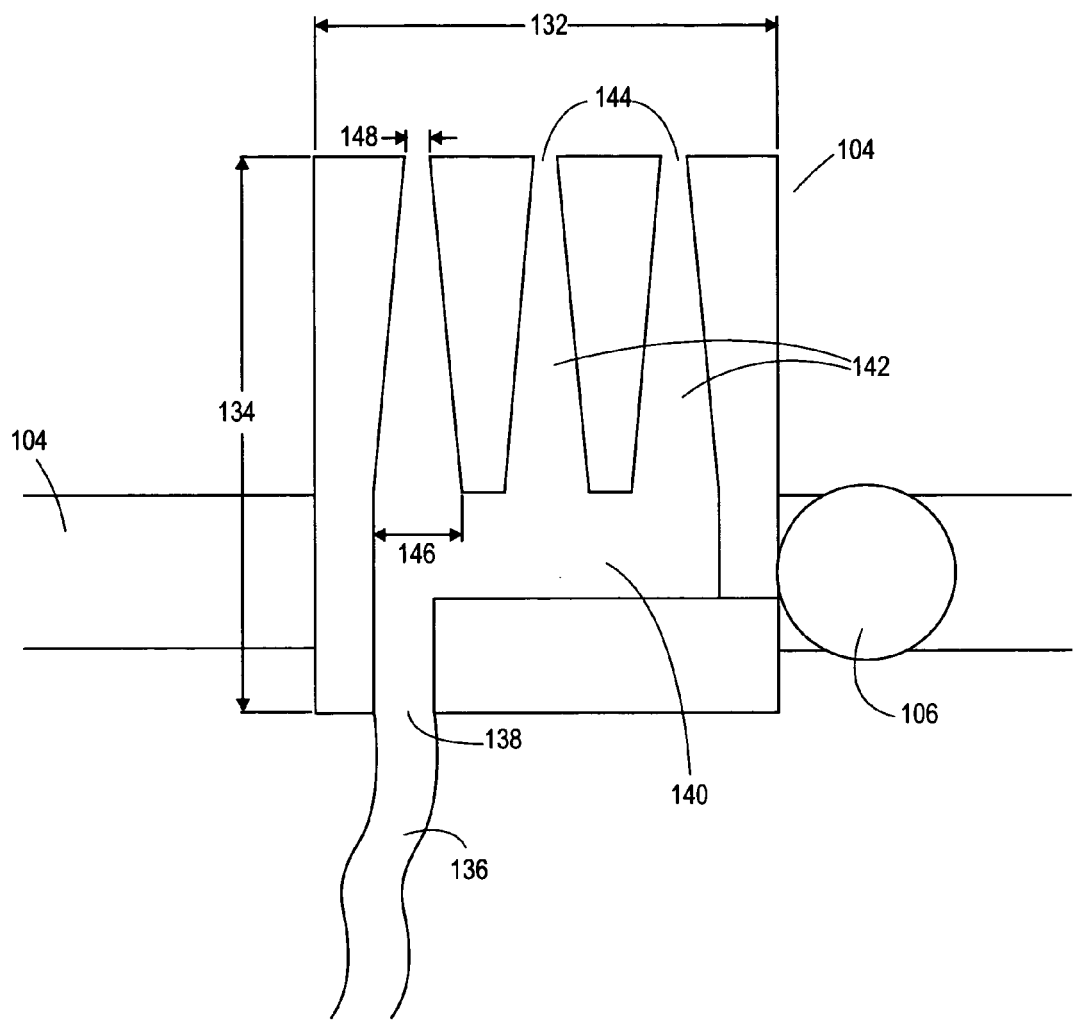
FIG. 4 is a cross-sectional side view of an ejector head.
Figure 5:
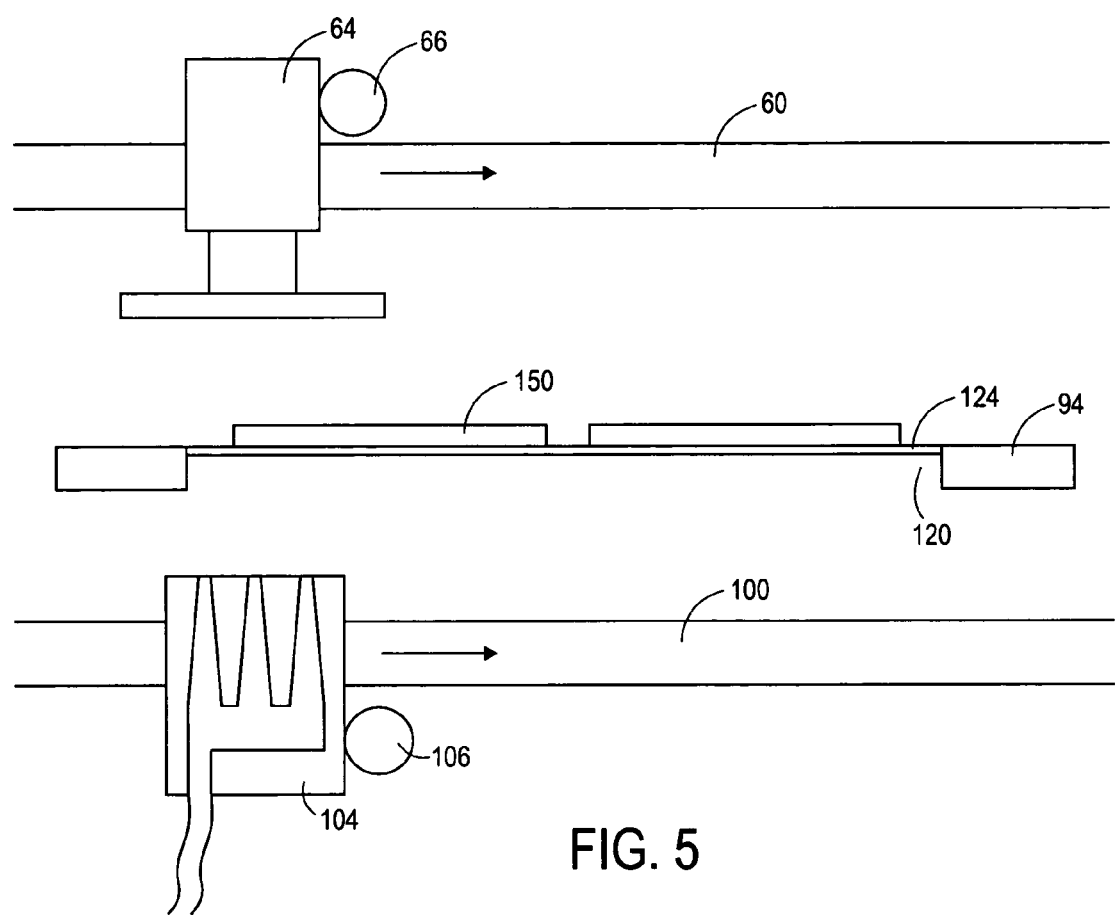
FIG. 5 is a cross-sectional side view of the die ejector.
Figure 6:
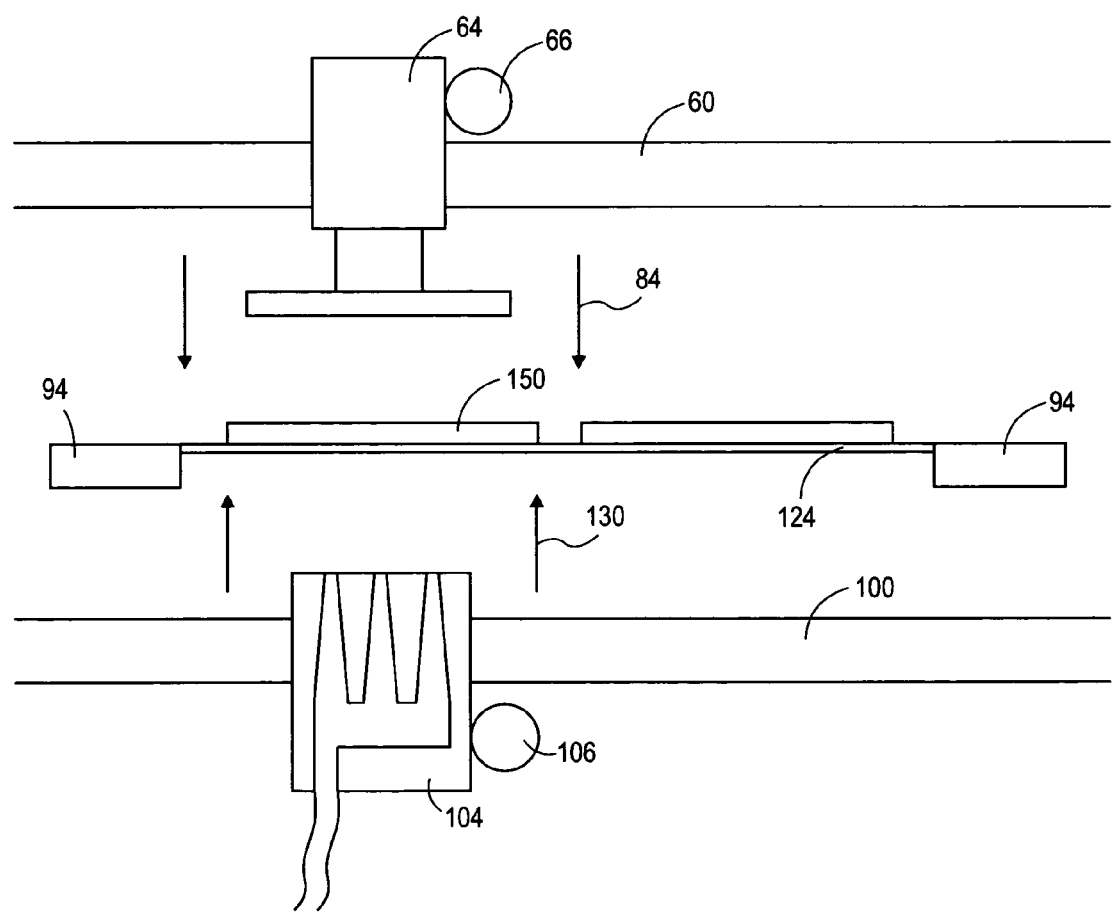
FIG. 6 is a cross-sectional side view of a die ejector.
Figure 7:
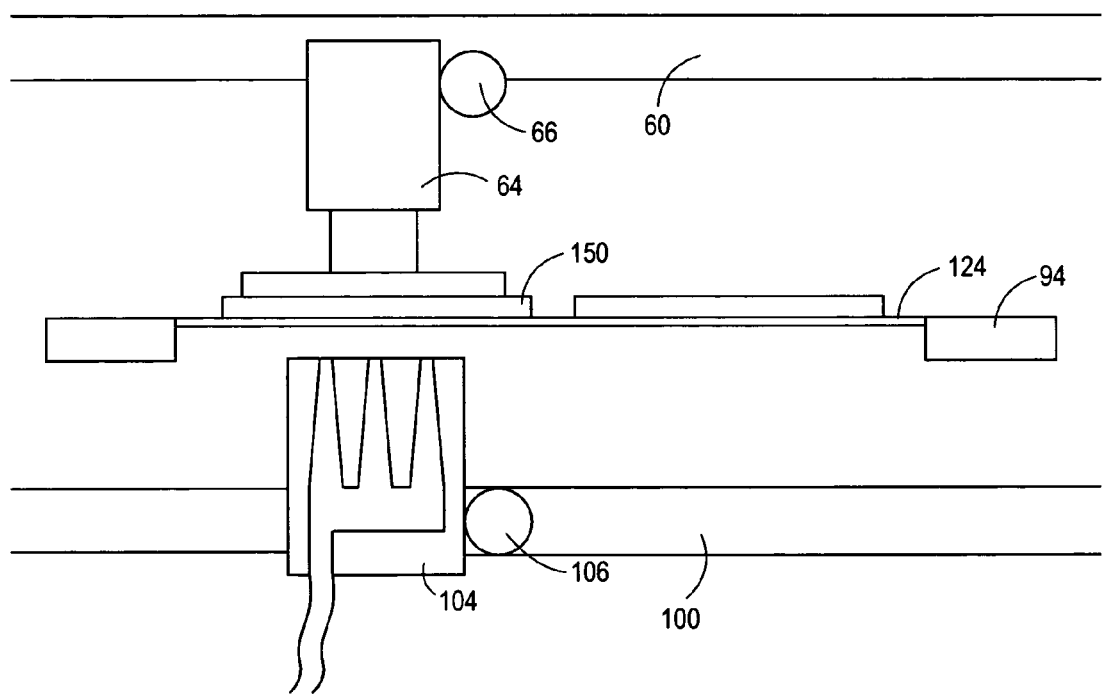
FIG. 7 is a cross-sectional side view of a die ejector.
Figure 8:
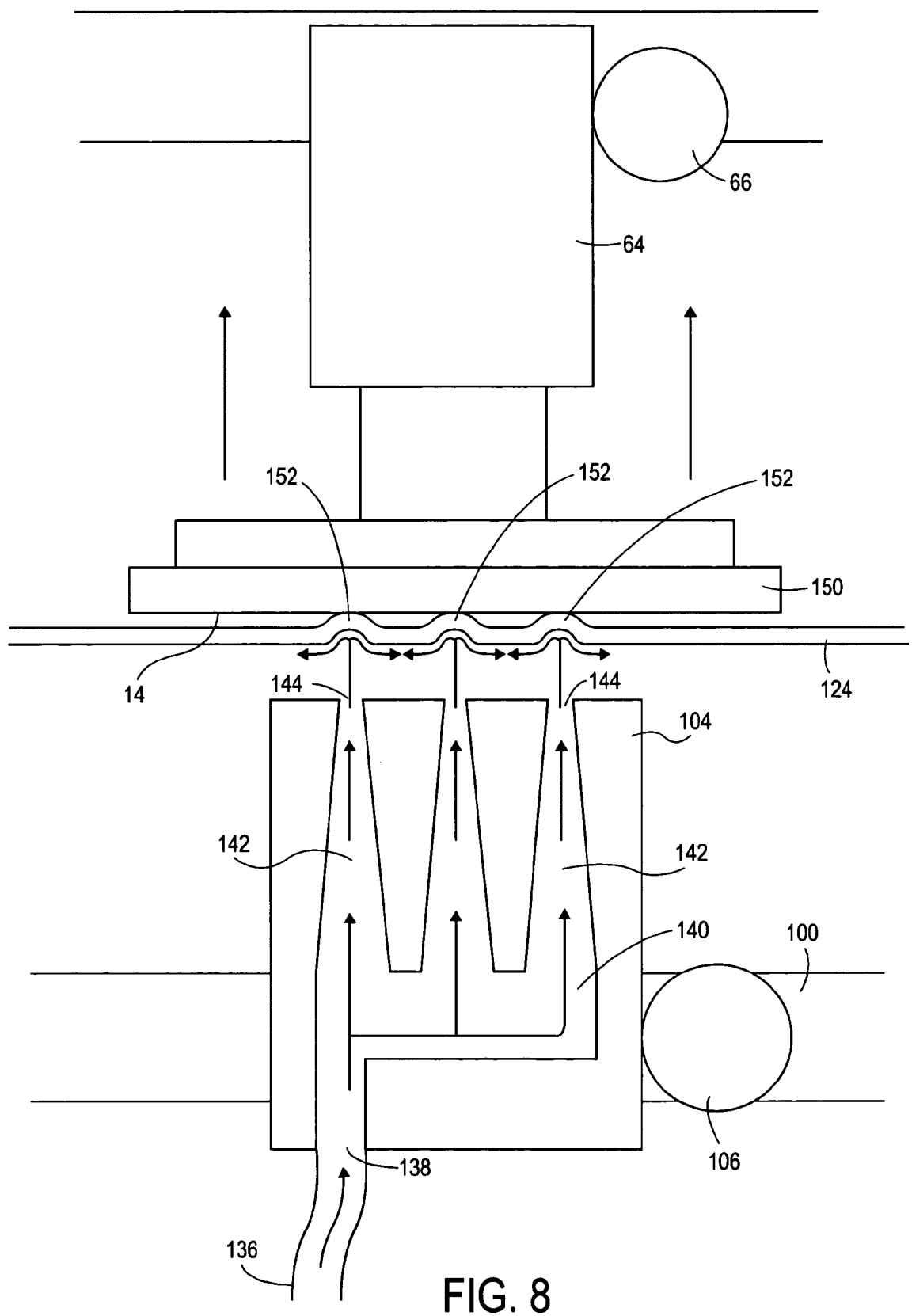
FIG. 8 is a cross-sectional side view of a die ejector.

FIG. 2 illustrates a system for handling microelectronic dies 30. The system 30 includes a frame 32, a pick-and-place subsystem 34, a computer control console 36, and a die ejector subsystem 38. The sawed, or diced, wafer 10 has been placed into the die ejector subsystem 38.

The pick-and-place subsystem 34 includes a transportation system 40 and a pick-and-place mechanism 42.

The transportation system 40 includes rollers 44 and a conveyor belt 46. The rollers 44 are mounted to the frame 32 at opposing ends thereof at a distance 48 of 600 mm. Each roller 44 has a length 50 of 800 mm. The conveyor belt 46 runs over the rollers 44. Four circuit boards 52, substrates, or dies, lie on the conveyor belt 46, and each circuit board 52 includes a plurality of selected formations 54. The selected formations 54 are each shaped to fit one of the microelectronic dies.

The pick-and-place mechanism includes two Y-pick arms 56, a Y-direction pick motor 58, an X-pick arm 60, and an X-direction pick motor 62, a pick-and-place head 64, or pick head, and a pick-and-place head motor 66.

The Y-pick arms 56 are mounted to the frame 32 at opposing ends thereof and extend over the conveyor belt 46 a distance 68 of 600 mm. The Y-pick arms 56 have a length 70 of 800 mm. The X-pick arm 60 is connected to the Y-pick arms 56 at opposing ends thereof by first 72 and second 74 XY junctions which are mounted to the Y-pick arms 56 such that the X-pick arm 60 may translate in a Y direction 76 between the Y-pick arms 56. The X-pick arm 60 extends over the conveyor belt 46 across the circuits boards 52 and has a length 80 of 600 mm. The Y-direction pick motor 58 is mounted to the frame 32 and connected to the second XY junction 74. The pick-and-place head 64 is mounted to the X-pick arm 60 and is suspended over the circuit boards 52. The pick-and-place head 64 is mounted to the X-pick arm 60 so that it may translate in an X direction 82 between the Y-pick arms 56 along the X-pick arm 60 and move transversely to the plane 26 in a Z direction 84 which is perpendicular to the plane 26. The X-direction pick motor 62 is mounted to the second XY junction 74 and connected to the pick-and-place head 64. The pick-and-place head motor 66 is mounted to the pick-and-place head 64 and connected to the X-pick arm 60.

The die ejector subsystem 38 includes the die ejector 86, a valve 88, a regulator 90, and a pressure pump 92. Although a pressure pump is shown, it should be understood that the word "pump" is meant to include any mechanism which can be used to flow fluid, such as a compressor. Here, the pressure pump 92 has high and low pressure sides. The low pressure side acts as an intake, and the high pressure sides acts as the outlet. The regulator, the valve, and the die ejector are connected to the high pressure side of the pump. The regulator 90 and the valve 88 are connected between the high pressure side of the pump 92 and the die ejector 86.

The computer control console 36 is electronically connected to the X-direction pick motor 62, the Y-direction motor 58, the die ejector 86, the valve 88, the regulator 90, and the pressure pump 92. The computer control console 36 is in the form of a computer having memory for storing set instructions and a process server connected to the memory for executing the instructions, as is commonly understood.

Referring to FIG. 3 through FIG. 8, the die ejector 86 includes a wafer plate 94, two Y-ejector arms 96, a Y-direction ejector motor 98, an X-ejector arm 100, an X-direction ejector motor 102, an ejector head 104, and an ejector head motor 106. The Y-ejector arms 96 are mounted to the frame 32 at a distance 108 of 400 mm. The Y-ejector arms 96 have a length 110 of 400 mm. The X-ejector arm 100 is connected to the Y-ejector arms 96 at opposing ends thereof by first 112 and second 114 XY junctions which are mounted to the Y-ejector arms 96 such that the X-ejector arm 100 may translate in a Y direction 116 between the Y-ejector arms 96. The wafer plate 94 is mounted between the two Y-ejector arms 96 and has a circular shape with a diameter 118 of approximately 400 mm. The wafer plate 94 has a hole 120 with a diameter 122 of 350 mm across which an adhesive sheet 124 is stretched. The wafer 10 is placed on the adhesive sheet 124 and the entire wafer 10 lies above the hole 120. The X-ejector arm 100 extends over the wafer plate 94 and across the wafer 10 and has a length 126 of approximately 400 mm. The Y-direction ejector motor 98 is mounted to the frame 32 and connected to the second XY junction 114. The ejector head 104 is mounted to the X-ejector arm 100 and is suspended beneath the wafer plate 94. The ejector head 104 is mounted to the X-ejector arm 100 so that it may translate in an X direction 128 between the Y-ejector arms 96 along the X-ejector arm 100 and move transversely to the plane is a Z direction 130 that is perpendicular to the plane 26. The X-direction ejector motor 102 is mounted to the second XY junction 114 and connected to the ejector head 104.

The ejector head 104 is cylindrical in shape with a diameter 132, for example, of between 0.5 mm and 20 mm and a height 134, for example, of between 2 mm and 40 mm and has a rectangular cross section. The ejector head 104 has a passageway therethrough and includes an air line 136, an intake 138, an air-delivery manifold 140, a plurality of nozzles 142, and an outlet 144 for each nozzle 142. The air line 136 connects the valve 88, the fluid regulator 90, and the high side of the pump 92 to the intake 138 of the ejector head 104. The nozzles 142 are tapered such that the nozzles 142 have a large diameter 146 of between 15 microns and 3 mm at a inner region of the ejector head and a small diameter 148 of between 15 microns and 3 mm at an outer region of the ejector head 104. Typically the large diameter 146 is larger than the small diameter 148. The ejector-head motor 106 is mounted to the ejector head 104 and connected to the X-ejector arm 100.

In use, referring specifically to FIG. 5 through FIG. 8, the computer control console 36 selects a microelectronic die 150 to be ejected and picked from the adhesive sheet 124 and the wafer 10. Moving in an a XY coordinate system, the pick-and-place head 64 of the pick-and-place subsystem 34 moves into a position over the selected microelectronic die 150. Likewise, also moving in an XY coordinate system, the ejector head 104 also moves into a position beneath the selected microelectronic die 150. When the pick-and-place head 64 is positioned over the selected microelectronic die 150, and the ejector head 104 is positioned beneath the selected microelectronic die 150, the respective heads move in the Z, or a vertical, directions 84 and 130 towards the selected microelectronic die 150. The pick-and-place head 64 lowers completely to contact the selected microelectronic die 150. The ejector head 104 moves upward toward the selected microelectronic die 150, however, it stops at a distance of 3 mm from the adhesive sheet 124.

Once the pick-and-place head 64 and the ejector head 104 are in position, the computer control console 36 activates the pressure pump 92 to deliver air to the regulator 90. The regulator 90 controls the volume and the pressure of the air that is delivered to the valve 88. The computer control console 36 controls the pump 92, the regulator 90, and the valve 88, such that an appropriate amount of air is delivered into the intake 138 through the air delivery manifold 140 and the nozzles 142 and out the outlets 144 of the ejector head 104.

The air that is released from the nozzles 142 impinges the adhesive sheet 124. The impingement changes the direction of the air flow and a force is exerted on the adhesive sheet 124. Portions 152 of the sheet 124 are lifted by the impingement and since the selected microelectronic die 150 is on the lifted portions 152, a force is exerted on the selected microelectronic die 150 also. Consequently, the microelectronic die 150 is separated from the adhesive sheet 124. At the same time, the pick-and-place head 64 lifts the selected microelectronic die 150 from the adhesive sheet 124. In this embodiment, the combination of the lifting action of the pick-and-place head 64 and the impingement of the air flowing from the nozzles 142 of the ejector head 104 separates the selected microelectronic die 150 from the adhesive sheet 124 and ejects the die 150 from the wafer 10.

After the selected microelectronic die 150 has been removed from the wafer 10, the pick-and-place head 64 returns to its original height and again, moving in the XY coordinate system, moves the selected microelectronic die 150 over one of the circuit boards 52 on the conveyor belt 46. The pick-and-place head 64 then lowers the selected microelectronic die 150 into one of the selected formations 54 on one of the circuit boards 52 and places it into the selected formation 54.

The computer control console 36 then selects another microelectronic die to be ejected from the wafer 10 and this process is repeated.

Using the fluid regulator 90, the computer control console 36 can adjust the force exerted on the selected dies so that the force is gradually increased so that the thin, brittle dies are less likely to break. The valve 88 can be used to stop and start again the flow of air while the pump 92 is activated.

One advantage is that a more gentle and more controllable die ejector is provided because air is used instead of the piercing pins. Another advantage is that because the forces on the dies can be more accurately controlled, the speed at which the dies are ejected is increased as the air, under control of the computer, can more quickly exerted the appropriate forces on the die to eject them from the wafer support without the dies cracking.

Other embodiments of the invention may coordinate the movements of the pick-and-place head and the ejector head differently. The ejector head may be raised to contact the adhesive sheet or even push the selected microelectronic die slightly upwards before the impingement occurs. The pick-and-place head need not be lowered to contact the selected microelectronic die. The pick-and-place head may be positioned at a height of a few millimeters above the selected microelectronic die such that when air flows from the nozzles of the ejector head to impinge the adhesive sheet the selected microelectronic die is lifted by the impingement into the pick-and-place head. In such an embodiment, it may be desirable to have holes in the adhesive sheet through which the air from the ejector head can flow and impinge the selected microelectronic die itself. The die ejector may have its own pick head separate and distinct from the pick-and-place head. The die ejector pick head can be moved in an XY coordinate system similar to the ejector heads coordinate system and on an apparatus similar to the ejector head however placed above, not below, the wafer support. Such pick heads typically remove the microelectronic die from the wafer and flip the die into a flipped position before the pick-and-place head of the pick-and-place subsystem removes the die from the pick head and places it on one of the circuit boards. The ejector head can be in any shape. Wafers of other sizes such as 200 mm diameters can also be used in the microelectronic die handling system.

What is claimed:

1. A system for handling microelectronic dies, comprising:
   a frame;
   a wafer support mounted to the frame to support a diced wafer comprising singulated microelectronic dies;
   an ejector head having a passageway therethrough and being connected to the frame for movement to move an outlet of the passageway into respective positions below respective selected microelectronic dies;
   a fluid pump having high and low pressure sides, the high pressure side being connected to the passageway to provide a fluid through the passageway, the fluid flowing from the outlet towards the selected microelectronic dies; and
   a pick head connected to the frame for movement into respective positions above the wafer to engage with and remove the selected microelectronic dies below which the outlet is located.

2. The system of claim 1, wherein the fluid impinges at least a portion of the wafer support, said impingement exerting a force on the selected microelectronic dies.

3. The system of claim 2, wherein said impingement separates at least a portion of the selected microelectronic dies from the wafer support.

4. The system of claim 3, wherein the ejector head has an intake and a plurality of outlets, the intake being connected to the high pressure side of the pump, the passageway connecting the intake and the outlets.

5. The system of claim 4, wherein the ejector head has a plurality of nozzles, each nozzle connecting the passageway and one of the plurality of outlets.

6. The system of claim 5, wherein the nozzles have a large diameter at an inner region of the ejector head and a small diameter at an outer region of the ejector head.

7. The system of claim 6, wherein the large diameter and the smaller diameter are between 15 microns and 3 mm.

8. The system of claim 7, wherein the ejector head is cylindrical with a height of between 2 mm and 40 mm and a diameter of between 0.5 mm and 20 mm.

9. The system of claim 8, wherein the wafer has a surface in a plane.

10. The system of claim 9, further comprising:
    a Y-ejector arm mounted to the frame;
    an X-ejector arm mounted for translating along the Y-ejector arm, the ejector head being mounted to the X-ejector arm for translating along the X-ejector arm and moving transversely to the plane;
    a Y-direction ejector actuator having a first component and a second component, the first component being secured to the Y-ejector arm, the second component being secured to the first component and being actuable to move relative to the first component, the second component being connected to the X-ejector arm such that movement of the second component relative to the first component causes the X-ejector arm to translate along the Y-ejector arm in a Y direction;
    an X-direction ejector actuator having a first component and a second component, the first component being secured to the X-ejector arm, the second component being secured to the first component and being actuable relative to the first component, the second component being connected to the ejector head such that movement of the second component relative to the first component causes the ejector head to translate along X-ejector arm in an X direction; and
    a Z-direction ejector actuator having a first component and a second component, the first component being secured to the X-ejector arm, the second component being secured to the first component and being actuable to move relative to the first component, the second component being connected to ejector head such that movement of the second component relative to the first component causes the ejector head to move transversely to the plane in a Z-direction, said translations and transverse movements moving the ejector head from a first position near the wafer to a second position near the wafer.

11. The system of claim 10, further comprising:
    a Y-pick arm mounted to the frame;
    an X-pick arm mounted for translating along the Y-pick arm, the pick head being mounted to the X-pick arm for translating along the X-pick arm and moving transversely to the plane;
    a Y-direction pick actuator having a first component and a second component, the first component being secured to the Y-pick arm, the second component being secured to the first component and being actuable to move relative to the first component, the second component being connected to the X-pick arm such that movement of the second component relative to the first component causes the X-pick arm to translate along the Y-pick arm in the Y direction;
    an X-direction pick actuator having a first component and a second component, the first component being secured to the X-pick arm, the second component being secured to the first component and being actuable relative to the first component, the second component being connected to the ejector head such that movement of the second component relative to the first component causes the ejector head to translate along the X-pick arm in the X direction; and
    a Z-direction pick actuator having a first component and a second component, the first component being secured to the X-pick arm, the second component being secured to the first component and being actuable to move relative to the first component, the second component being connected to pick head such that a movement of the second component relative to the first component causes the pick head to move transversely to the plane in the Z direction, said translations and transverse movements moving the pick head from a third position away from the wafer to a fourth position near the wafer.

12. The system of claim 11, wherein the second position is below the fourth position.

13. The system of claim 12, wherein the Z direction is perpendicular to the plane.

14. The system of claim 13, wherein the X direction and the Y direction are parallel to the plane.

15. The system of claim 14, wherein the X direction is perpendicular to the Y direction.

16. The system of claim 15, further comprising:
a fluid regulator to regulate to regulate the volume and pressure of the fluid flowing into the intake of the ejector head;
a valve to shut off the flow of fluid into the intake of the ejector head; and
a computer control console electrically connected to said actuators, the fluid pump, the fluid regulator, and the valve.

17. The system of claim 16, wherein the fluid regulator and the valve are connected to the high pressure side of the fluid pump and the intake of the ejector head.

18. The system of claim 17, wherein the computer control console controls said actuators, the fluid pump, the fluid regulator, and the valve such that the ejector head is in the second position, the pick head is in the fourth position, and the fluid flows from the outlets of the ejector head at the same time and said actuators, the fluid pump, the fluid regulator, and the valve are connected to a common power source.

19. The system of claim 18, wherein the fluid is a gas.

20. The system of claim 19, wherein the fluid is air.

21. A system for ejecting a microelectronic die from a semiconductor wafer, comprising:
a frame;
a wafer support mounted to the frame to support a diced wafer comprising singulated microelectronic dies;
an ejector head having a passageway therethrough and being connected to the frame for movement to move an outlet of the passageway below respective selected microelectronic dies;
a means for providing fluid through the passageway, the fluid flowing from the outlet towards the selected microelectronic dies; and
a pick head connected to the frame for movement into respective positions above the wafer to engage with and remove the selected microelectronic dies below which the outlet is located.

22. The system of claim 21, wherein the fluid flows from the outlet towards the selected microelectronic dies in a first direction and the system further comprises a means for changing the flow of the fluid to a second direction, said change in direction of the flow of fluid exerting a force which at least assists in the lifting of the selected microelectronic die from a plane of the wafer.

23. The system of claim 22, wherein the wafer has a surface in a plane and the pick head is connected to the frame for moving transversely to the plane in a Z direction and the system further comprises a means for moving the pick head in the Z direction.

24. A system for handling microelectronic dies, comprising:
a frame;
a wafer support mounted to the frame to support a diced wafer comprising singulated microelectronic dies, the wafer having a surface in a plane;
a Y-ejector arm mounted to the frame;
an X-ejector arm mounted for translating along the Y-ejector arm;
A Y-direction ejector actuator having a first and component and a second component, the first component being secured to the Y-ejector arm, the second component being secured to the first component and being actuable to move relative to the first component, the second component being connected to the X-ejector arm such that movement of the second component relative to the first component causes the X-ejector arm to translate along the Y-ejector arm in a Y-direction;
an ejector head having an intake, an outlet, and a passageway therethrough connected the intake and the outlet, the ejector head being mounted to the X-ejector arm for translating along the X-ejector arm and moving transversely to the plane;
an X-direction ejector actuator having a first component and a second component, the first component being secured to the X-ejector arm, the second component being secured to the first component and being actuable relative to the first component, the second component being connected to the ejector head such that movement of the second component relative to the first component causes the ejector head to translate along the X-ejector arm in an X direction;
a Z-direction ejector actuator having a first component and a second component, the first component being secured to the X-ejector arm, the second component being secured to the first component and being actuable to move relative to the first component, the second component being connected to the ejector head such that movement of the second component relative to the first component causes the ejector head to move transversely to the plane in a Z direction, said translations and transverse movements moving the outlet into respective positions below respective selected microelectronic dies;
a fluid pump having high and low pressure sides, the high pressure side being connected to the intake to provide a fluid through the passageway, the fluid flowing from the outlet towards the selected microelectronic and impinges at least a portion of the wafer support, said impingement exerting a force on the selected microelectronic dies;
a Y-pick arm mounted to the frame;
an X-pick arm mounted for translating along the Y-pick arm;
a Y-direction pick actuator having a first and a second component, the first component being secured to the Y-pick arm, the second component being secured to the first component and being actuable to move relative to the first component, the second component being connected to the X-pick arm such that movement of the second component relative to the first component causes the X-pick arm to translate along the Y-pick arm in the Y direction;
a pick head being mounted to the X-pick arm for translating along the X-pick arm and moving transversely to the plane to move into respective positions above the wafer to engage with and remove the selected microelectronic dies below which the outlet is located;
an X-direction pick actuator having a first component and a second component, the first component being secured to the X-pick arm, the second component being secured to the first component and being actuable to move relative to the first component, the second component being connected to the pick head such that a movement of the second component relative to the first component causes the pick head to translate along the X-pick arm in the X direction; and a Z-direction pick actuator having a first component and a second component, the first component being secured to the X-pick arm, the second component being secured to the first component and being actuable to move relative to the first component, the second component being connected to the pick head such that movement of the second component relative to the first component causes the ejector head to move transversely to the plane in the Z direction, said translations and transverse movements moving the pick head into respective positions above the wafer to engage with and remove the selected microelectronic dies below which the outlet is located.

25. The system of claim 24, further comprising:

a fluid regulator to regulate the volume and pressure of the fluid flowing into the intake of the ejector head, the fluid regulator being connected to the high pressure side of the fluid pump;

a valve to shut off the flow of fluid into the intake of the ejector head, the valve being connected to the fluid regulator and the intake of the ejector head; and a computer control console connected to said actuators, the fluid pump, the fluid regulator, and the valve to controls said actuators, the fluid pump, the fluid regulator, and the valve such that the ejector head and the pick head are in the respective positions below and above the selected microelectronic die and the fluid flows from the outlet of the ejector head at the same time.

26. The system of claim 25, wherein the said actuators, the fluid pump, the fluid regulator, and the valve are connected to a common power source.

* * * * *